(12) United States Patent
Park

(10) Patent No.: US 8,019,564 B2
(45) Date of Patent: Sep. 13, 2011

(54) SYSTEMS AND METHODS FOR CALIBRATING THE LOOP BANDWIDTH OF A PHASE-LOCKED LOOP (PLL)

(75) Inventor: Chan Hong Park, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 17 days.

(21) Appl. No.: 11/970,329

(22) Filed: Jan. 7, 2008

(65) Prior Publication Data

US 2009/0174446 A1 Jul. 9, 2009

(51) Int. Cl.
*G06F 3/00* (2006.01)

(52) U.S. Cl. ......... 702/107; 702/108; 702/179; 702/182

(58) Field of Classification Search ............ 702/66, 702/69, 107, 108, 182; 327/156; 331/17; 455/183.1
See application file for complete search history.

(56) References Cited

U.S. PATENT DOCUMENTS

| | | | |
|---|---|---|---|
| 5,594,388 A * | 1/1997 | O'Shaughnessy et al. ... | 331/1 R |
| 6,490,441 B1 * | 12/2002 | Saito ........................ | 455/183.1 |
| 6,670,855 B2 | 12/2003 | Sumi | |
| 6,731,145 B1 * | 5/2004 | Humphreys et al. ......... | 327/156 |
| 6,731,712 B1 * | 5/2004 | Lindstrom et al. ........... | 375/376 |
| 6,972,633 B2 * | 12/2005 | Vilhonen et al. ............ | 331/17 |
| 7,038,552 B2 | 5/2006 | Brett et al. | |
| 7,095,287 B2 * | 8/2006 | Maxim et al. ................. | 331/44 |
| 7,301,414 B2 | 11/2007 | Hino | |
| 7,372,339 B2 | 5/2008 | Fu | |

OTHER PUBLICATIONS

M. Cassia, P. Shah and E. Bruun, "A Calibration Method for PLLs Based on Transient Response," Circuits and Systems, 2004, ISCAS 2004, vol. 4, pp. IV481-IV484, May 2004.
T.A.D. Riley, M.A. Copeland and T.A. Kwasniewski, "Delta-Sigma Modulation in Fractional-N Frequency Synthesis," IEEE Journal of Solid-State Circuits, vol. 28, No. 5, pp. 553-559, May 1993.
M.H. Perrott, T.L. Tewksbury, C.G. Sodini, "A 27-mW CMOS Fractional-N Synthesizer using Digital Compensation for 2.5-Mb/s GFSK Modulation," IEEE Journal of Solid-State Circuits, vol. 32, No. 12, pp. 2048-2060, Dec. 1997.
B. Razavi, "RF Microelectronics," Prentice Hall, pp. 264, 1998.

(Continued)

*Primary Examiner* — Mohamed Charioui
*Assistant Examiner* — Felix E Suarez
(74) *Attorney, Agent, or Firm* — Larry Moskowitz

(57) ABSTRACT

A method for calibrating the loop bandwidth of a phase-locked loop (PLL) is described. At least one resistor in the PLL filter is tuned in accordance with the frequency of an input reference signal. One or more capacitors in the PLL filter are tuned in accordance with the frequency of the input reference signal. Output pulses of one or more voltage controlled oscillators (VCO) are counted. A first charge pump current associated with a target loop bandwidth is counted in accordance with the counted output pulses. A programmable charge pump current is tuned to the calculated first charge pump current.

35 Claims, 8 Drawing Sheets

OTHER PUBLICATIONS

D.R. McMahill, and C.G. Sodini, "A 2.5-Mb/s GFSK 5.0-Mb/s 4-FSK Automatically Calibrated Σ—Δ Frequency Synthesizer," IEEE Journal of Solid-State Circuits, vol. 37, No. 1, pp. 18-26, Jan. 2002.

M. Cassia, P. Shah and E. Bruun, "A Spur-Free Fractional-N ΣΔ PLL for GSM Applications: Linear Model and Simulations," Proc. IEEE International Symposium on Circuits and Systems, vol. 1, pp. 1065-1068, Bangkok, Thailand, May 2003.

M. Cassia, P. Shah and E. Bruun, "A Novel PLL Calibration Method," Proc. 21st IEEE NORCHIP Conference, pp. 252-255, Riga, Latvia, Nov. 2003.

Hauspie, D. et al.: "Wideband VCO With Simultaneous Switching of Frequency Band, Active Core, and Varactor Size," IEEE Journal of Solid-State Circuits, Piscataway, NJ, US, vol. 42, No. 7, (Jul. 1, 2007), pp. 1472-1480, XP011186322, ISSN: 0018-9200.

* cited by examiner

SYSTEMS AND METHODS FOR CALIBRATING THE LOOP BANDWIDTH OF A PHASE-LOCKED LOOP (PLL)

TECHNICAL FIELD

The present disclosure relates generally to signal processing and signal processing-related technologies. More specifically, the present disclosure relates to systems and methods for calibrating the loop bandwidth of a phase-locked loop (PLL).

BACKGROUND

Phase-locked loop (PLL) frequency synthesizers may be used as building blocks in many types of systems, such as audio and video processing systems, communication systems and in other systems, such as processing systems. A PLL is a device which generates an output signal with an output frequency that is a function of the frequency of a reference signal. When a PLL is implemented in a device, the frequency of the output signal may frequently change. For example, the frequency of the output signal may change at the start-up of the device or when the device changes from one channel to another.

The PLL may include certain components connected in a feedback loop. For example, the PLL may include a voltage controlled oscillator (VCO), a phase frequency detector (PFD) and a loop filter. The PLL may additionally include a feedback frequency divider in applications where the VCO frequency is designed to be a multiple of the reference frequency.

The PFD may control the frequency of the output signal of the VCO. The PFD in the PLL receives the output signal in the feedback loop and compares the frequency of the output signal to the frequency of the reference signal. Based on the comparison of the frequency of the output signal to the frequency of the reference signal, the PFD generates a control signal that is provided to the low-pass filter and then to the VCO in order to control the frequency of the output signal of the VCO.

However, there may be a large variation in the loop bandwidth of the PLL. In addition, the PLL settling times and noise performance may severely deteriorate. Therefore, benefits may be realized by providing improved phase locked loop filters.

DETAILED DESCRIPTION

Figure 1:
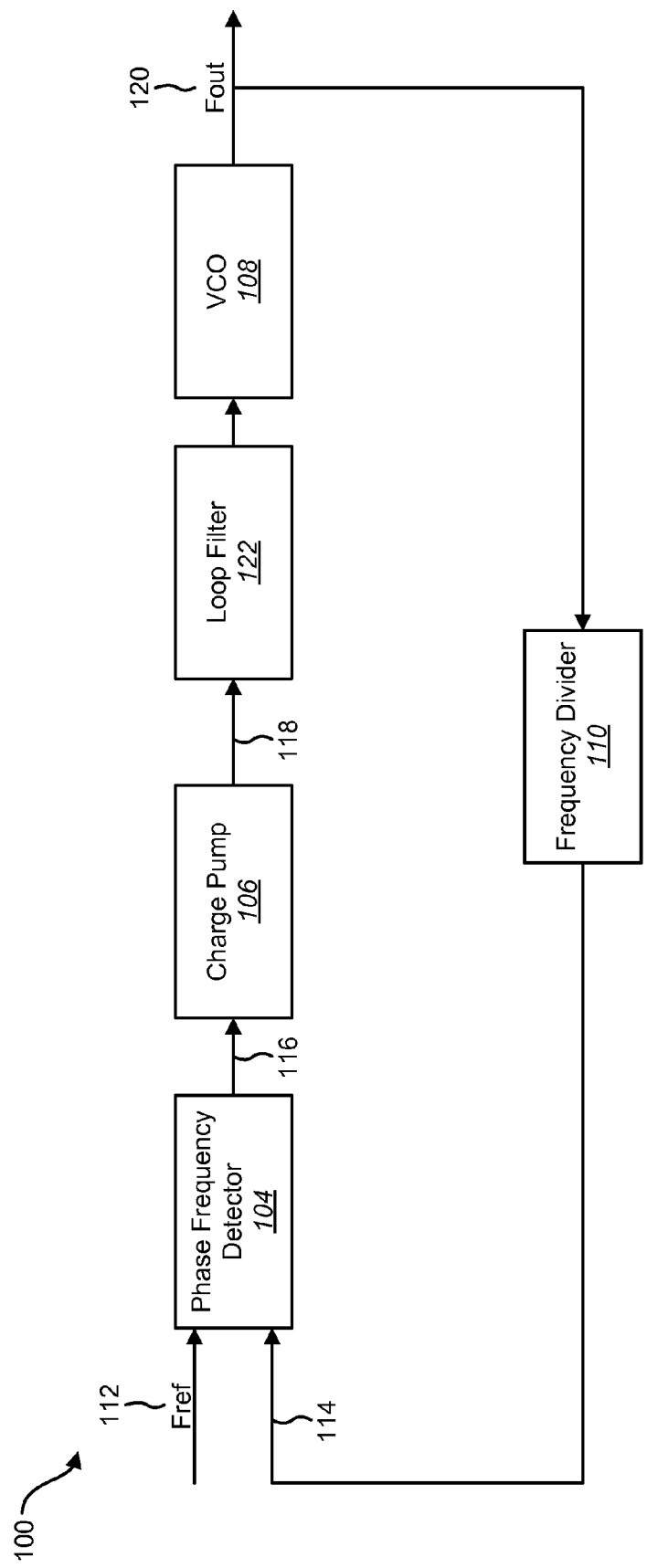
FIG. 1 is a block diagram illustrating one configuration of a phase-locked loop (PLL) frequency synthesizer.

A method for calibrating the loop bandwidth of a phase-locked loop (PLL) is described. At least one resistor in the PLL filter is tuned in accordance with the frequency of an input reference signal. One or more capacitors in the PLL filter are tuned in accordance with the frequency of the input reference signal. Output pulses of one or more voltage controlled oscillators (VCO) are counted. A first charge pump current associated with a target loop bandwidth is counted in accordance with the counted output pulses. A programmable charge pump current is tuned to the calculated first charge pump current.

A circuit for calibrating the loop bandwidth of a phase-locked loop (PLL) is also described. The circuit includes at least one resistor. The at least one resistor is tuned in accordance with the frequency of a input reference signal. The circuit also includes one or more capacitors. The one or more capacitors are tuned in accordance with the frequency of the input reference signal. The circuit further includes a voltage controlled oscillator (VCO) counter. The VCO counter counts output pulses of one or more voltage controlled oscillators. In addition, the circuit includes a digital signal processor (DSP). The DSP calculates a first charge pump current associated with a target loop bandwidth in accordance with the counted output pulses. The DSP tunes a programmable charge pump current to the calculated first charge pump current.

An apparatus for calibrating the loop bandwidth of a phase-locked loop (PLL) is also described. The apparatus includes means for tuning at least one resistor in the PLL in accordance with the frequency of an input reference signal and means for tuning one or more capacitors in the PLL in accordance with the frequency of the input reference signal. The apparatus also includes means for counting output pulses of one or more voltage controlled oscillators (VCO) and means for calculating a first charge pump current associated with a target loop bandwidth in accordance with the counted output pulses. In addition, the apparatus includes means for tuning a programmable charge pump current to the calculated first charge pump current.

A computer-program product for calibrating the loop bandwidth of a phase-locked loop (PLL) is also described. The computer-program product includes a computer readable medium having instructions thereon. The instructions include code for tuning one or more resistors in the PLL in accordance with the frequency of an input reference signal and code for tuning one or more capacitors in the PLL in accordance with the frequency of the input reference signal. The instructions also include code for counting output pulses of one or more voltage controlled oscillators (VCO), code for calculating a first charge pump current associated with a target loop bandwidth in accordance with the counted output pulses and code for tuning a programmable charge pump current to the calculated first charge pump current.

Phase-locked loop (PLL) systems may be used in analog and digital circuits. These systems may include a phase frequency detector (PFD), charge pump and voltage controlled oscillator (VCO) connected in a feedback configuration. The VCO produces the output signal of the PLL, and the various components of the PLL may cooperate to cause the output signal to tend toward and eventually lock on to a desired output frequency, which is based on the frequency of a reference signal applied as an input to the PFD. For example, PLL systems may be configured to produce an output signal having the same frequency as the input signal, or having an output frequency which is a factor x/y of the input frequency.

The PLL is an electronic control system that also generates an output signal (Fout) that has a fixed relation to the phase of an input reference signal (Fref). As such, the output signal of a PLL circuit may respond to both the frequency and the phase of the input reference signal. The PLL may automatically raise or lower the frequency of the VCO until it is matched to the input reference signal in both frequency and phase. The PLL may be an example of a control system that implements negative feedback.

A PLL may be used in radio, telecommunications, computers and other electronic applications. The PLL may generate stable frequencies, recover a signal from a noisy communication channel or distribute clock timing pulses in digital logic designs, such as microprocessors. A single integrated circuit may provide a PLL building block. As such, PLLs may be used in modern electronic devices, with output frequencies that range from a fraction of a cycle per second up to many gigahertz.

In one configuration, the loop bandwidth of a PLL determines the settling time and the noise/jitter performance of the PLL. The settling time refers to the time that has elapsed from the application of the input reference signal until the output signal settles to a certain value. Noise may refer to unwanted electronic signals that may distort the output signal. In one configuration, jitter refers to the unwanted variation of one or more signal characteristics in electronics and telecommunications. Jitter may be the interval between successive pulses, or the amplitude, frequency or phase of successive cycles. Minimizing or reducing uncontrolled noise and jitter in the output signal is an important design issue in PLL systems. As previously mentioned, jitter is the variation in the phase and/or frequency of the output signal when the system is aligned or very nearly aligned.

Accordingly, the settling time and noise/jitter performance are important characteristics to consider in the design of a PLL. Therefore, there is a need to optimize the loop bandwidth of the PLL depending on the particular application in order to reduce the settling time, noise and jitter characteristics of the PLL. However, the loop bandwidth is a function of multiple variables which may vary over temperature variations and other processes. In addition, a PLL may include multiple voltage controlled oscillators (VCO). These multiple VCOs may be referred to as VCO banks. In one configuration, an inductor/capacitor (LC)-type VCO with multiple banks may include a VCO gain (Kvco) that is different between the multiple banks. The difference in Kvco across multiple VCO banks may also affect the loop bandwidth of the PLL. As such, there is a need for systems and methods that improve the calibration of the PLL in order to maintain the same loop bandwidth for the PLL over temperature/process variations and over various VCO banks.

FIG. 1 is a block diagram illustrating one configuration of a phase-locked loop (PLL) 100. The PLL 100 may include a phase frequency detector 104, a charge pump 106, a loop filter 122 and a voltage controlled oscillator (VCO) 108. In addition, the PLL 100 may include a feedback path that includes a frequency divider 110. The phase detector 104 may be a device that compares at least two frequencies 112, 114. A first input frequency 112 may be the frequency of an input reference signal (Fref). A second input frequency 114 may be the frequency of an output signal 120 (Fout) provided by the feedback path. The phase frequency detector 104 may generate a first output signal 116 that is a measure of the phase difference between the first input frequency 112 and the second input frequency 114.

The charge pump 106 may be an electronic circuit that implements capacitors as energy storage elements to create either a higher or lower voltage power source. The charge pump 106 may supply charge amounts in proportion to the phase error detected by the phase frequency detector 104. A second output signal 118 from the charge pump may be input to the VCO 108. The VCO 108 may be an inductive oscillator (LC oscillator), which oscillates by charging and discharging a capacitor through an inductor. The VCO 108 may vary its frequency in response to a control voltage.

The VCO 108 may generate the output signal 120 (Fout). The output signal 120 may also be transmitted to a frequency divider 110. The divider 110 may be placed between the VCO 108 and the phase frequency detector 104 in a feedback loop. The divider 110 may be placed between the VCO 108 and the phase frequency detector 104 to produce a frequency synthesizer. In one configuration, the frequency divider 110 may be implemented in radio transmitter applications.

Figure 2:
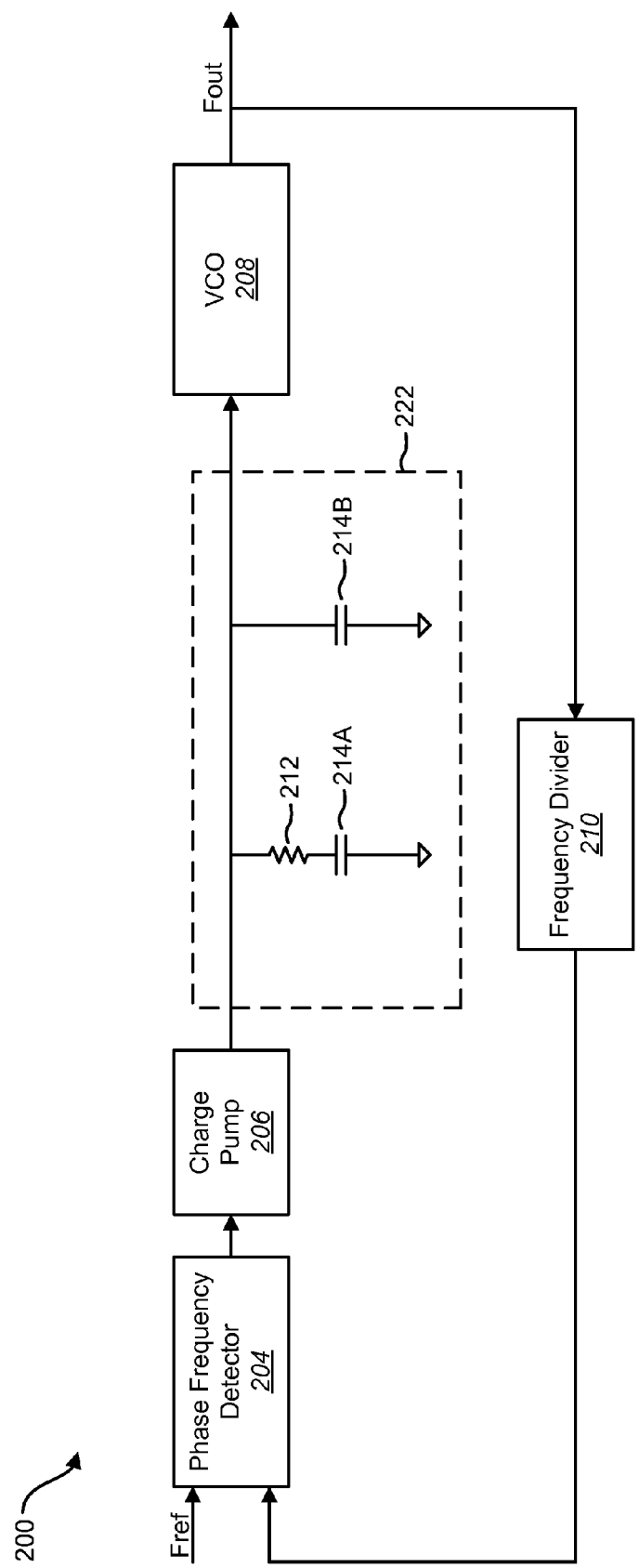
FIG. 2 is a block diagram of a charge pump PLL with a $2^{nd}$ order loop filter.

FIG. 2 is a block diagram of a charge pump PLL 200 with a $2^{nd}$ order loop filter 222. The PLL 200 includes a phase frequency detector 204, a charge pump 206, a VCO 208 and a frequency divider 210. The frequency divider 210 may be placed between the VCO 208 and the phase frequency detector 204. The PLL 200 further includes a loop filter 222. The loop filter 222 may include a resistor 212 and a plurality of capacitors 214A, 214B. In one configuration, the open loop transfer function of the PLL 200 is represented as:

$$G(s) = \frac{I_{cp}}{2\pi} \cdot \frac{1+s/Z}{sC_1(1+s/P)} \cdot \frac{K_{vco}}{Ns} \qquad \text{Equation 1}$$

where $I_{cp}$ represents the current applied to the charge pump 206. In addition, P and Z may be represented as:

$$P = \frac{1}{RC_2}, \quad Z = \frac{1}{R(C_1+C_2)} \qquad \text{Equation 2}$$

The loop bandwidth, $f_{BW}$ may be defined as the frequency where the open loop gains equals unity, such as:

$$|G(j2\pi f_{BW})|=1 \qquad \text{Equation 3}$$

As such, the loop bandwidth may be a function of the charge pump current ($I_{cp}$), the R/C's in the loop filter and the gain of the VCO (Kvco). Accordingly, the loop bandwidth may be represented as:

$$f_{BW}=f(I_{cp},K_{VCO},R,C_1,C_2) \qquad \text{Equation 4}$$

As such, to maintain a constant loop bandwidth, a plurality of variables may be tuned or calibrated. In one configuration, the plurality of variables may include $I_{cp}$, $K_{vco}$, R, $C_1$ and $C_2$.

Figure 3:
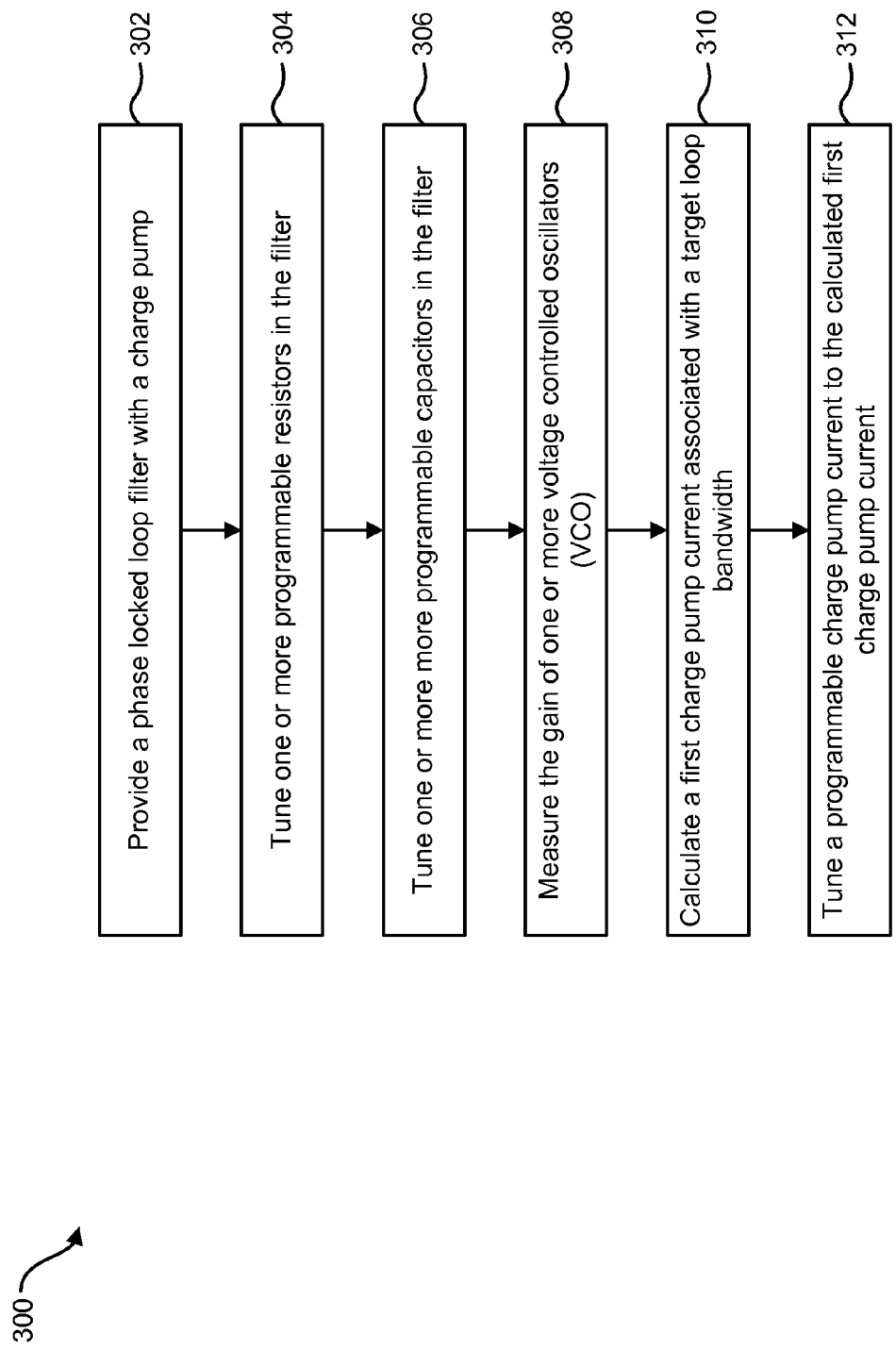
FIG. 3 is a flow diagram illustrating one example of a method for calibrating the loop bandwidth of the PLL.

FIG. 3 is a flow diagram illustrating one example of a method 300 for calibrating the loop bandwidth of a PLL. In one example, the loop bandwidth is calibrated over a VCO bank and temperature/process variations in the PLL system. In one example, a PLL with a charge pump may be provided 302. One or more programmable resistors in the filter may be tuned 304 according to the frequency of a reference input signal. In one configuration, one or more programmable capacitors in the filter may also be tuned 306 according to the frequency of the reference input signal.

In one example, the gain of each VCO in the VCO bank may be measured 308. In addition, a first charge pump current associated with a target loop bandwidth for the PLL is calculated 310. Further, a programmable charge pump current may be tuned 312. In one configuration, the programmable charge pump current may be tuned 312 to match the calculated first charge pump current.

Figure 4:
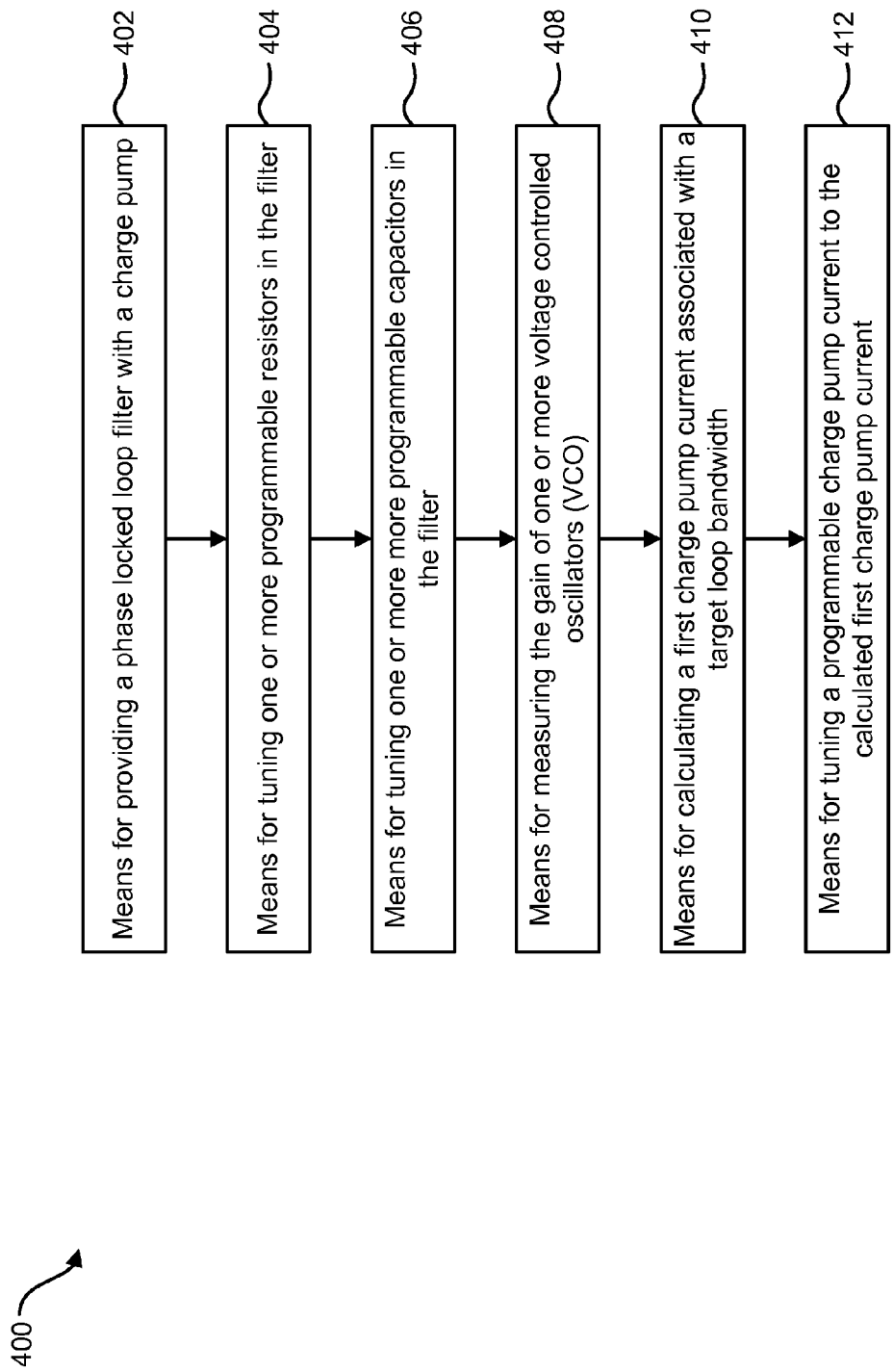
FIG. 4 illustrates means plus function blocks corresponding to the method shown in FIG. 3.

The method 300 of FIG. 3 described above may be performed by various hardware and/or software component(s) and/or module(s) corresponding to the means-plus-function blocks illustrated in FIG. 4. In other words, blocks 302 through 312 illustrated in FIG. 3 correspond to means-plus-function blocks 402 through 412 illustrated in FIG. 4.

Figure 5:
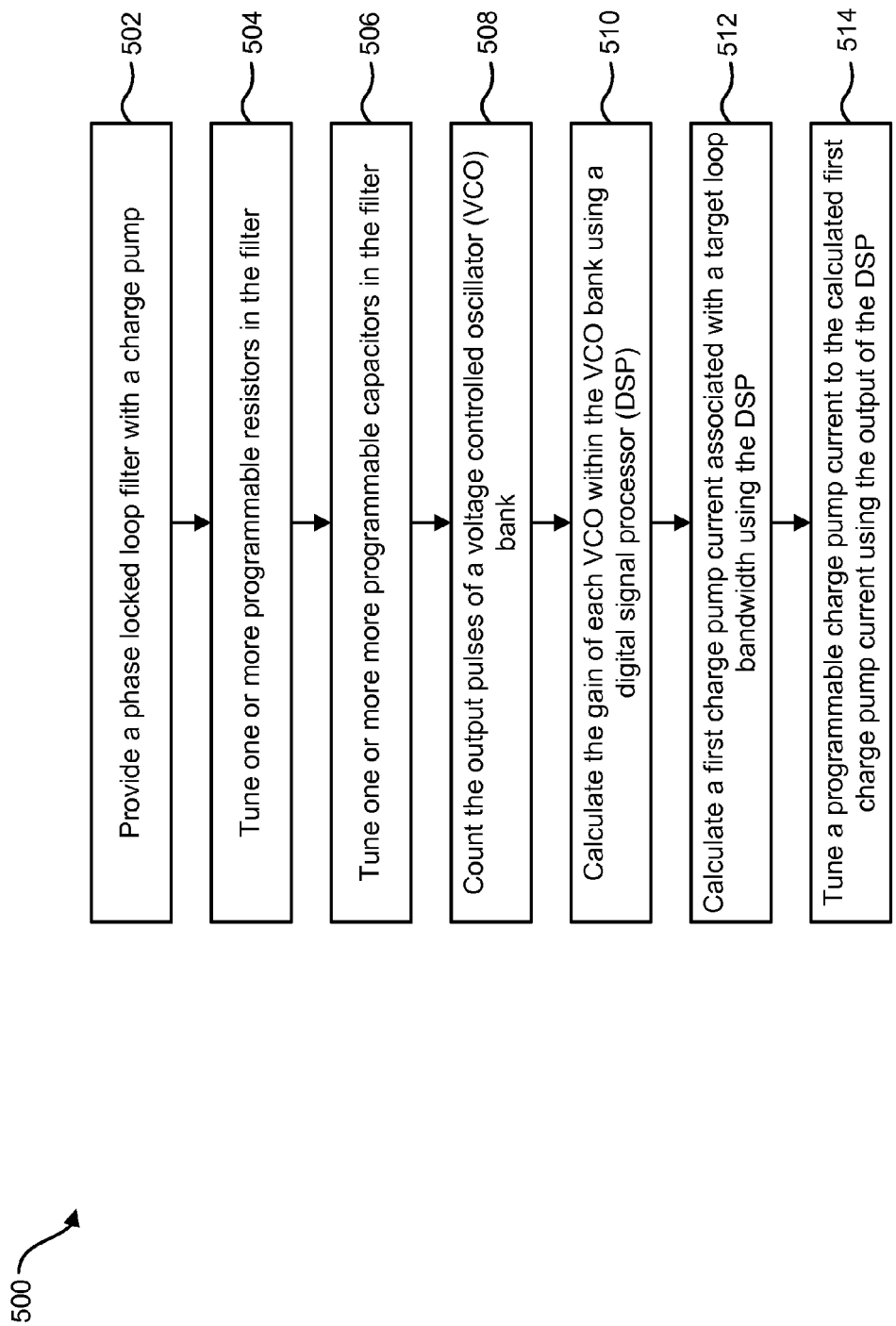
FIG. 5 is a flow diagram illustrating a further example of a method for calibrating the loop bandwidth of the PLL.

FIG. 5 is a flow diagram illustrating a further example of a method 500 for calibrating the loop bandwidth of a PLL. In one configuration, a PLL with a charge pump is provided 502. One or more programmable resistors in the filter may be tuned 504 according to the frequency of a reference input signal. In addition, one or more programmable capacitors in the filter may also be tuned 506 in accordance with the frequency of the reference input signal. The output pulses of each VCO within a VCO bank may be counted 508. In one example, the output pulses are counted 508 by a frequency divider 110 placed between the VCO and the phase frequency detector of the PLL in a feedback loop.

In one configuration, the gain of each VCO within the VCO bank may be calculated 510. In one example, the gain of each VCO is calculated 510 using a digital signal processor (DSP). In another example, a first charge pump current is calculated 512. The first charge pump current may be calculated to produce a target loop bandwidth for the PLL. In addition, the first charge pump current may be calculated 512 using the DSP. Further, a programmable charge pump current may be tuned 514. In one configuration, the programmable charge pump current may be tuned 514 to match the calculated first charge pump current. The programmable charge pump current may be tuned 514 to match the first charge pump current using the output of the DSP.

Figure 6:
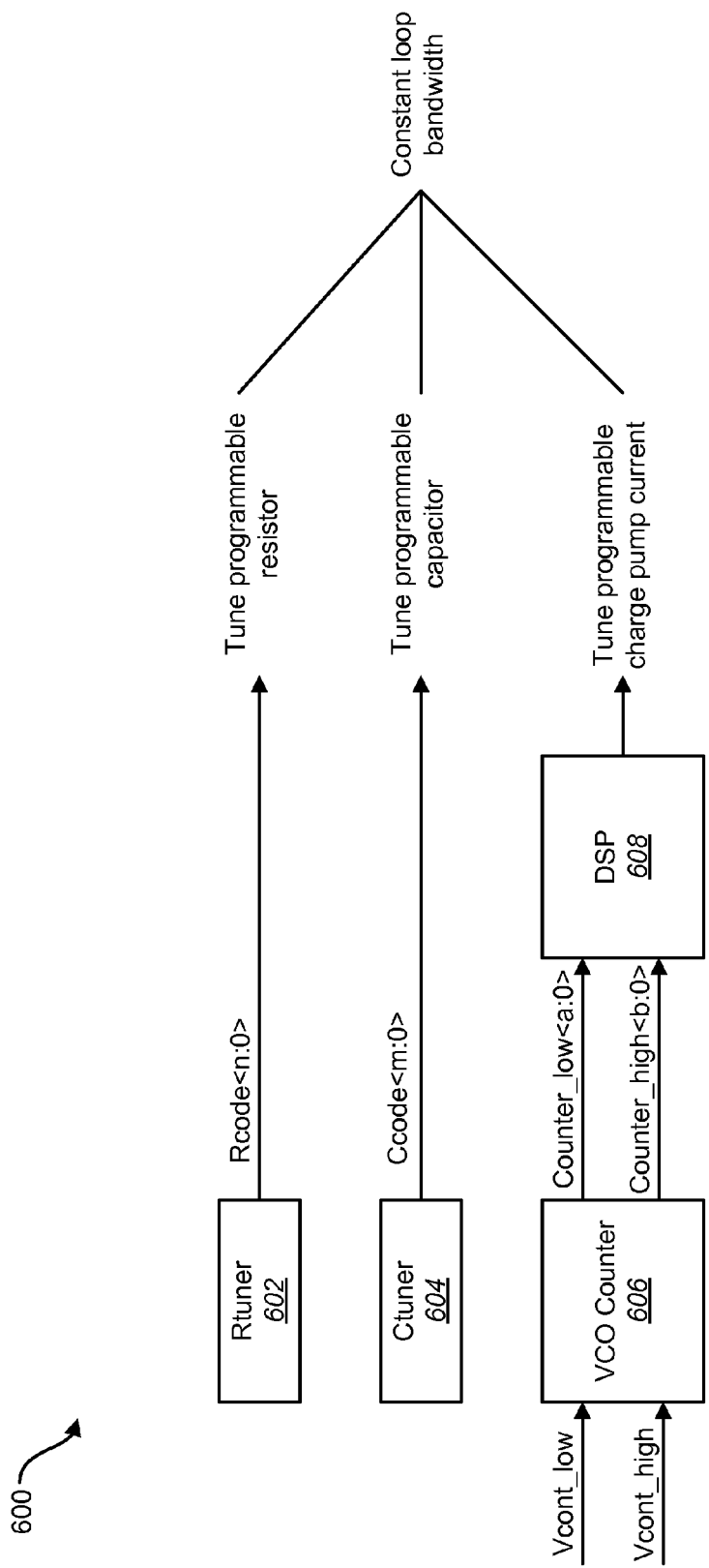
FIG. 6 is a block diagram illustrating a method to calibrate the loop bandwidth of the PLL over various VCO banks and temperature/process variations.

FIG. 6 is a block diagram 600 illustrating a method to calibrate the loop bandwidth of a PLL over a VCO bank and temperature/process variations. In one example, resistors used in the charge pump of the PLL are programmable resistors. The programmable resistors may be tuned according to the frequency of an input signal using an Rtuner 602. In addition, one or more capacitors used in the charge pump of the PLL may be programmable capacitors. The programmable capacitors may be tuned according to the frequency of an input signal using a Ctuner 604. In one configuration, a VCO counter 606 may be implemented in the PLL. The counter 606 may count the VCO output pulses for two different cases. For example, the counter 606 may count the lower control voltages and the higher control voltages of the output pulses.

In one example, a DSP 608 may receive the counts of the lower and higher control voltages. The DSP 608 may calculate the gain (Kvco) of each VCO within the VCO bank from the two outputs of the VCO counter 606. The DSP 608 may also calculate the charge pump current ($I_{cp}$) that produces a desired target loop bandwidth. The charge pump current may be programmable. The Kvco for each VCO within the VCO bank may be calculated as:

$$K_{VCO} = \frac{(\text{Counter\_high} - \text{Counter\_low})/\text{Counting\_period}}{\text{Vcont\_high} - \text{Vcont\_low}} \quad \text{[Equation 5]}$$

The output of the DSP 608 may be used to tune the programmable charge pump current ($I_{cp}$) in accordance with the frequency of the input signal. The calibration of the loop bandwidth may be executed digitally. In addition, the calibration result may be stored in a look-up table for each VCO bank or temperature/process variation.

Figure 7:
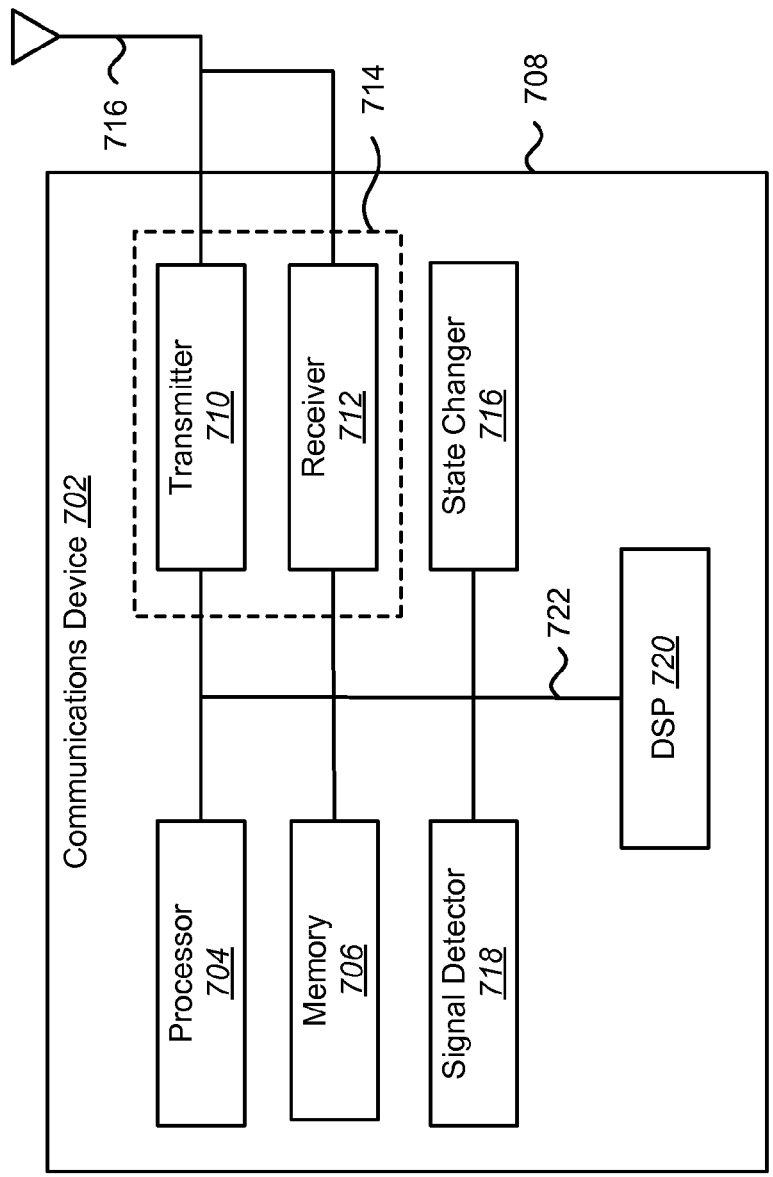
FIG. 7 illustrates various components that may be utilized in a communications device.

FIG. 7 illustrates various components that may be utilized in a communications device 702. The communications device 702 is an example of a device that may be configured to implement the various methods described herein. For example, the communications device 702 may be a mobile telecommunications device, such as a cellular telephone or handset.

The communications device 702 may include a processor 704 which controls operation of the communications device 702. The processor 704 may also be referred to as a central processing unit (CPU). Memory 706, which may include both read-only memory (ROM) and random access memory (RAM), provides instructions and data to the processor 704. A portion of the memory 706 may also include non-volatile random access memory (NVRAM). The processor 704 typically performs logical and arithmetic operations based on program instructions stored within the memory 706. The instructions in the memory 706 may be executable to implement the methods described herein.

The communications device 702 may also include a housing 708 that may include a transmitter 710 and a receiver 712 to allow transmission and reception of data between the communications device 702 and a remote location. The transmitter 710 and receiver 712 may be combined into a transceiver 714. An antenna 716 may be attached to the housing 708 and electrically coupled to the transceiver 714. The communications device 702 may also include (not shown) multiple transmitters, multiple receivers, multiple transceivers and/or multiple antenna.

The communications device 702 may also include a signal detector 718 that may be used to detect and quantify the level of signals received by the transceiver 714. The signal detector 718 may detect such signals as total energy, pilot energy per pseudonoise (PN) chips, power spectral density, and other signals. The communications device 702 may also include a digital signal processor (DSP) 720 for use in processing signals.

The various components of the communications device 702 may be coupled together by a bus system 722 which may include a power bus, a control signal bus, and a status signal bus in addition to a data bus. However, for the sake of clarity, the various busses are illustrated in FIG. 7 as the bus system 722.

Figure 8:
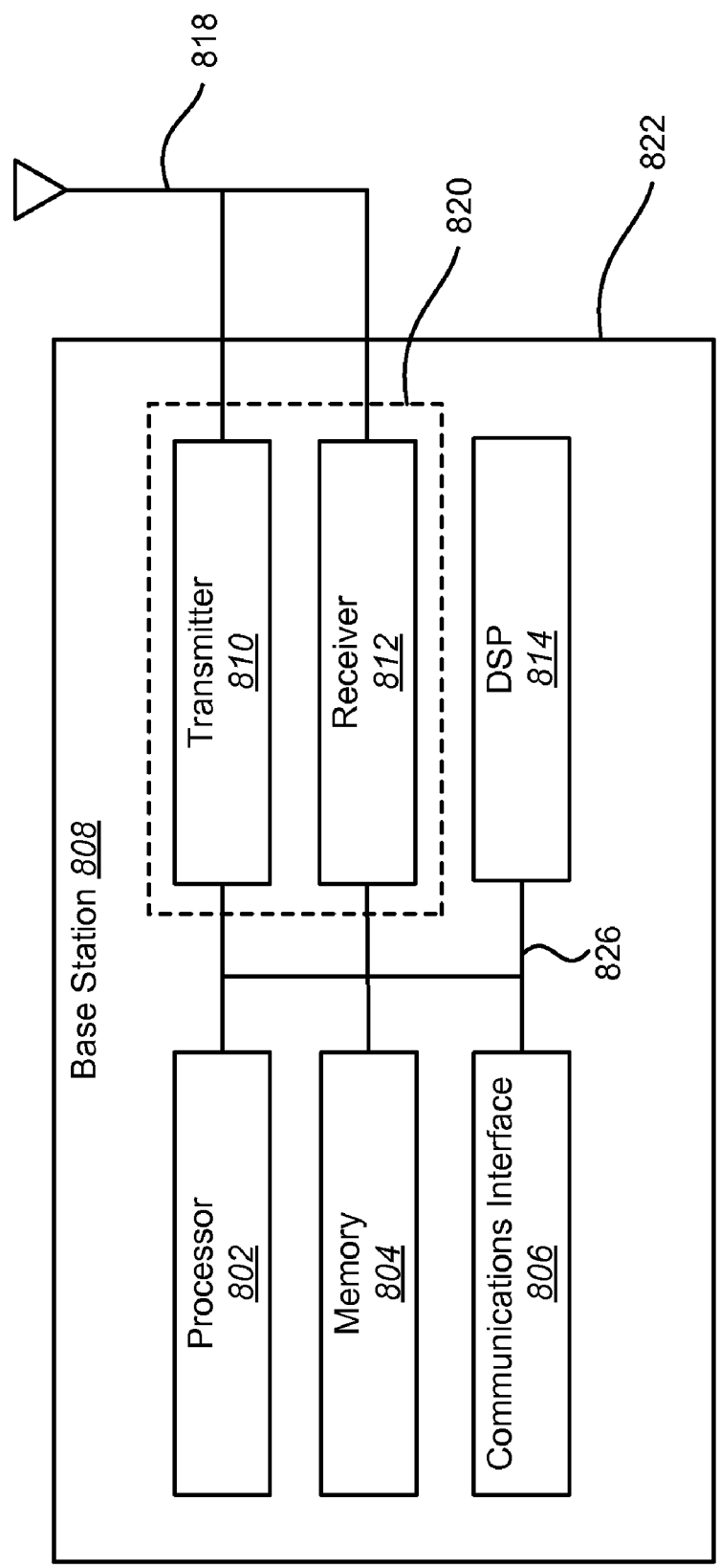
FIG. 8 is a block diagram of a base station in accordance with one example of the disclosed systems and methods.

FIG. 8 is a block diagram of a base station 808 in accordance with one example of the disclosed systems and methods. Examples of different implementations of a base station 808 include, but are not limited to an evolved NodeB (eNB), a base station controller, a base station transceiver, an access router, etc. The base station 808 includes a transceiver 820 that includes a transmitter 810 and a receiver 812. The transceiver 820 may be coupled to an antenna 818. The base station 808 further includes a digital signal processor (DSP) 814, a general purpose processor 802, memory 804, and a communications interface 806. The various components of the base station 808 may be included within a housing 822.

The processor 802 may control operation of the base station 808. The processor 802 may also be referred to as a CPU. The memory 804, which may include both read-only memory (ROM) and random access memory (RAM), provides instructions and data to the processor 802. A portion of the memory 804 may also include non-volatile random access memory (NVRAM). The memory 804 may include any electronic component capable of storing electronic information, and may be embodied as ROM, RAM, magnetic disk storage media, optical storage media, flash memory, on-board memory included with the processor 802, EPROM memory, EEPROM memory, registers, a hard disk, a removable disk, a CD-ROM, etc. The memory 804 may store program instructions and other types of data. The program instructions may be executed by the processor 802 to implement some or all of the methods disclosed herein.

In accordance with the disclosed systems and methods, the antenna 818 may receive reverse link signals that have been transmitted from a nearby communications device 702. The antenna 818 provides these received signals to the transceiver 820 which filters and amplifies the signals. The signals are provided from the transceiver 820 to the DSP 814 and to the general purpose processor 802 for demodulation, decoding, further filtering, etc.

The various components of the base station 808 are coupled together by a bus system 826 which may include a power bus, a control signal bus, and a status signal bus in addition to a data bus. However, for the sake of clarity, the various busses are illustrated in FIG. 8 as the bus system 826.

As used herein, the term "determining" (and grammatical variants thereof) is used in an extremely broad sense. The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer, a computing device, or an electronic device. By way of example, and not limitation, a computer-readable medium may comprise RAM, ROM, EEPROM, CD-ROM, networked streamed or other optical disk storage, magnetic disk storage or other magnetic storage devices, or any other medium that can be used to carry or store desired program code in the form of instructions or data structures and that can be accessed by a computer, a computing device, or an electronic device. Disk and disc, as used herein, includes compact disc (CD), laser disc, optical disc, digital versatile disc (DVD), floppy disk and Blu-Ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for calibrating the loop bandwidth of a phase-locked loop (PLL), comprising:
   tuning at least one resistor in the PLL in accordance with the frequency of an input reference signal;
   tuning one or more capacitors in the PLL in accordance with the frequency of the input reference signal;
   counting variable output pulses of one or more voltage controlled oscillators (VCO), counting lower control voltages of the variable output pulses, and counting higher control voltages of the variable output pulses;
   calculating a first charge pump current associated with a target loop bandwidth in accordance with the counted variable output pulses, the counted lower control voltages and the counted higher control voltages; and
   tuning a programmable charge pump current to the calculated first charge pump current.

2. The method of claim 1, further comprising calculating the gain (Kvco) of each of the one or more voltage controlled oscillators (VCO) in the PLL.

3. The method of claim 1, further comprising calculating the gain of the one or more VCOs using the counted output pulses.

4. The method of claim 1, further comprising tuning the at least one resistor using an R-tuner.

5. The method of claim 1, further comprising tuning the one or more capacitors using a C-tuner.

6. The method of claim 2, wherein each of the gains (Kvco) of the one or more VCOs is calculated as a function of a lower control voltage (Vcont_low), a higher control voltages (Vcont_high), a count of the lower control voltage (Counter_low), a count of the higher control voltage (Counter_high), and a period (Counting_period) over which the count of the lower control voltage and the higher control voltage is measured, the function being:

$$K_{VCO} = ((\text{Counter\_high} - \text{Counter\_low})/\text{Counting\_period})/$$
$$(\text{Vcont\_high} - \text{Vcont\_low}).$$

7. The method of claim 1, wherein a digital signal processor (DSP) calculates the first charge pump current associated with the target loop bandwidth.

8. The method of claim 1, wherein the gains of each of the one or more VCOs is calculated by a DSP.

9. The method of claim 1, further comprising maintaining a constant loop bandwidth over each of the VCOs.

10. The method of claim 1, further comprising maintaining a constant loop bandwidth over variations in the temperature.

11. The method of claim 1, wherein the at least one resistor in the PLL is a programmable resistor.

12. The method of claim 1, wherein the one or more capacitors in the PLL are programmable capacitors.

13. A circuit for calibrating the loop bandwidth of a phase-locked loop (PLL), the circuit comprising:
    at least one resistor, wherein the at least one resistor is tuned in accordance with the frequency of a input reference signal;
    one or more capacitors, wherein the one or more capacitors are tuned in accordance with the frequency of the input reference signal;
    a voltage controlled oscillator (VCO) counter, wherein the VCO counter counts variable output pulses of one or more voltage controlled oscillators, lower control voltages of the variable output pulses, and higher control voltages of the variable output pulses;
    a digital signal processor (DSP), wherein the DSP calculates a first charge pump current associated with a target loop bandwidth in accordance with the counted variable output pulses, the counted lower control voltages and the counted higher control voltages; and
    wherein the DSP tunes a programmable charge pump current to the calculated first charge pump current.

14. The circuit of claim 13, wherein the circuit is an integrated circuit.

15. The circuit of claim 13, wherein the circuit is integrated in a communications device.

16. The circuit of claim 15, wherein the circuit is integrated in a handset.

17. The circuit of claim 15, wherein the circuit is integrated in a base station.

18. The circuit of claim 13, wherein the DSP calculates the gain (Kvco) of each of the one or more voltage controlled oscillators (VCO) in the PLL.

19. The circuit of claim 13, wherein the DSP calculates the gain of the one or more VCOs using the counted output pulses.

20. The circuit of claim 19, wherein the DSP calculates each of the gains (Kvco) of the one or more VCOs as a function of a lower control voltage (Vcont_low), a higher control voltages (Vcont_high), a count of the lower control voltage (Counter_low), a count of the higher control voltage (Counter_high), and a period (Counting_period) over which the count of the lower control voltage and the higher control voltage is measured, the function being:

$$K_{VCO} = ((\text{Counter\_high} - \text{Counter\_low})/\text{Counting\_period})/$$
$$(\text{Vcont\_high} - \text{Vcont\_low}).$$

21. The circuit of claim 13, wherein the DSP maintains a constant loop bandwidth over each of the VCO.

22. The circuit of claim 15, wherein the DSP maintains a constant loop bandwidth over variations in the temperature of the communications device.

23. An apparatus for calibrating the loop bandwidth of a phase-locked loop (PLL), comprising:
    means for tuning at least one resistor in the PLL in accordance with the frequency of an input reference signal;
    means for tuning one or more capacitors in the PLL in accordance with the frequency of the input reference signal;
    means for counting variable output pulses of one or more voltage controlled oscillators (VCO), lower control voltages of the variable output pulses, and higher control voltages of the variable output pulses;
    means for calculating a first charge pump current associated with a target loop bandwidth in accordance with the counted variable output pulses, the counted lower control voltages and the counted higher control voltages; and
    means for tuning a programmable charge pump current to the calculated first charge pump current.

24. The apparatus of claim 23, further comprising means for calculating the gain (Kvco) of each of the one or more voltage controlled oscillators (VCO) in the PLL.

25. The apparatus of claim 23, further comprising means for calculating the gain of the one or more VCOs using the counted output pulses.

26. The apparatus of claim 24, wherein each of the gains (Kvco) of the one or more VCOs is calculated as a function of a lower control voltage (Vcont_low), a higher control voltages (Vcont_high), a count of the lower control voltage (Counter_low), a count of the higher control voltage (Counter_high), and a period (Counting_period) over which the count of the lower control voltage and the higher control voltage is measured, the function being:

$$K_{VCO} = ((\text{Counter\_high} - \text{Counter\_low})/\text{Counting\_period})/(V\text{cont\_high} - V\text{cont\_low}).$$

27. The apparatus of claim 23, wherein a digital signal processor (DSP) calculates the first charge pump current associated with the target loop bandwidth.

28. The apparatus of claim 23, wherein the gains of the each of the one or more VCOs is calculated by a DSP.

29. The apparatus of claim 23, further comprising means for maintaining a constant loop bandwidth over each of the VCOs.

30. The apparatus of claim 23, further comprising means for maintaining a constant loop bandwidth over variations in the temperature of the apparatus.

31. A non-transitory storage medium having processor-executable instructions stored thereon, the instructions being configured to cause a processor to perform operations for calibrating the loop bandwidth of a phase-locked loop (PLL), the operations comprising:
- tuning one or more resistors in the PLL in accordance with the frequency of an input reference signal;
- tuning one or more capacitors in the PLL in accordance with the frequency of the input reference signal;
- counting variable output pulses of one or more voltage controlled oscillators (VCO), lower control voltages of the variable output pulses, and higher control voltages of the variable output pulses;
- calculating a first charge pump current associated with a target loop bandwidth in accordance with the counted variable output pulses, the counted lower control voltages, and the counted higher control voltages; and
- tuning a programmable charge pump current to the calculated first charge pump current.

32. The non-transitory storage medium of claim 31, wherein the stored processor-executable instructions are configured to cause a processor to perform operations further comprising calculating the gain ($K_{vco}$) of each of the one or more voltage controlled oscillators (VCO) in the PLL.

33. The non-transitory storage medium of claim 31, wherein the stored processor-executable instructions are configured to cause a processor to perform operations further comprising calculating the gain of the one or more VCOs using the counted output pulses.

34. The non-transitory storage medium of claim 31, wherein the stored processor-executable instructions are configured to cause a processor to perform operations further comprising maintaining a constant loop bandwidth over each of the VCOs.

35. The non-transitory storage medium of claim 31, wherein the stored processor-executable instructions are configured to cause a processor to perform operations further comprising maintaining a constant loop bandwidth over variations in the temperature.

* * * * *